United States Patent
Yu

(10) Patent No.: US 6,703,281 B1
(45) Date of Patent: Mar. 9, 2004

(54) DIFFERENTIAL LASER THERMAL PROCESS WITH DISPOSABLE SPACERS

(75) Inventor: Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/274,038

(22) Filed: Oct. 21, 2002

(51) Int. Cl.[7] .................. H01L 21/336; H01L 21/44
(52) U.S. Cl. .............. 438/303; 438/310; 438/305; 438/652; 438/653
(58) Field of Search ................... 438/303, 305, 438/301, 149, 230, 231, 233, 203, 199, 505, 506, 508, 507, 592, 366, 683, 652, 653; 257/412, 408

(56) References Cited

U.S. PATENT DOCUMENTS

| | | | | |
|---|---|---|---|---|
| 6,187,620 B1 | * | 2/2001 | Fulford et al. | 438/230 |
| 6,258,680 B1 | * | 7/2001 | Fulford et al. | 438/305 |
| 6,559,015 B1 | * | 5/2003 | Yu | 438/301 |
| 6,579,750 B1 | * | 6/2003 | Krivokapic | 438/149 |
| 6,593,198 B2 | * | 7/2003 | Segawa | 438/303 |
| 6,610,565 B2 | * | 8/2003 | Kim et al. | 438/233 |

* cited by examiner

Primary Examiner—Michael S. Lebentritt

(57) ABSTRACT

MOSFETs are fabricated with accurately defined, high and uniformly concentrated source/drain regions and extensions employing plural, sequential pre-amorphizing, implanting and laser thermal annealing steps with intervening spacer removal. Embodiments include forming sidewall spacers on a gate electrode, sequentially pre-amorphizing, ion implanting and laser thermal annealing to form deep source/drain regions, removing the sidewall spacers, and then sequentially pre-amorphizing, ion implanting and laser thermal annealing to form shallow source/drain extensions.

11 Claims, 5 Drawing Sheets

DIFFERENTIAL LASER THERMAL PROCESS WITH DISPOSABLE SPACERS

FIELD OF THE INVENTION

The present invention relates to a method of manufacturing semiconductor devices with sub-micron dimensions. The present invention has particular applicability in manufacturing high density semiconductor devices with transistors having reduced short-channel effects and improved silicide contact resistance.

BACKGROUND ART

The increasing demand for micro-miniaturization requires scaling down various horizontal and vertical dimensions in various device structures. As the depth of the ion implanted source/drain junctions of transistors is scaled down, there is a corresponding scaled increase in the substrate channel doping in order to maintain a constant electric field in the transistor channel for higher speed performance. These objectives are achieved, in part, by not only forming shallow junctions but also forming source/drain extensions with an abrupt junction/dopant profile slope in proximity to the transistor channel in order to reduce penetration of the source/drain dopant into the transistor channel which occurs as the junction/profile slope becomes less abrupt. Such short channel effects result in poor threshold voltage roll-off characteristics for sub-micron devices.

The demand for micro-miniaturization also requires reduced contact silicide contact resistance. This objective can be achieved by forming a uniformly high dopant concentration at the upper surface of the substrate. However, it is very difficult to provide a uniform high dopant concentration at the upper surface of the substrate.

There exists a continuing need for methodology enabling the fabrication of semiconductor devices containing transistors with accurately defined source/drain extensions and source/drain regions with a uniformly high dopant concentration at the upper surface of the substrate.

DISCLOSURE OF THE INVENTION

An advantage of the present invention is a method of manufacturing a semiconductor device having reduced short-channel effects.

Another advantage of the present invention is a method of manufacturing a semiconductor device having scaled MOSFETs with reduced silicide contact resistance.

Additional advantages and other features of the present invention will be set forth in the description which follows and, in part, will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method manufacturing a semiconductor device, the method comprising: forming a gate electrode, having an upper surface and side surfaces, over an upper surface of a substrate with a gate insulating layer therebetween; forming first sidewall spacers on the side surfaces of the gate electrode; ion implanting to form deep pre-amorphized regions extending into the substrate defining future deep source/drain regions; ion implanting an impurity into the deep pre-amorphized regions forming deep source/drain implants; laser thermal annealing to recrystallize the deep pre-amorphized regions and activate the deep source/drain regions; removing the first sidewall spacers; ion implanting to form shallow pre-amorphized regions on each side of the gate electrode extending into the substrate defining future shallow source/drain extensions; ion implanting an impurity into the shallow pre-amorphized region; and laser thermal annealing to recrystallize the shallow pre-amorphized regions and activate the shallow source/drain extensions.

Embodiments include forming second sidewall spacers on the gate electrode after activating the shallow source/drain extensions and forming metal silicide layers on the upper surface of the gate electrode and on the upper surface of the semiconductor substrate overlying the deep source/drain regions. Further embodiments of the present invention comprise forming an oxide liner on the side surfaces of the gate electrode and a portion of the upper surface of the substrate and forming silicon nitride sidewall spacers as both the first and second sidewall spacers.

Additional advantages of the present invention will be readily apparent to those skilled in the art from the following detailed description wherein the embodiments of the present invention are described simply by way of illustration of the best mode contemplated for carry out the present invention. As will be realized, the present invention is capable of other and different embodiments, and its several details are capable of modifications in various obvious respects, all without departing from the present invention. Accordingly, the drawings and description are to be regarded as illustrative in nature, not as restrictive.

BRIEF DESCRIPTION OF THE DRAWINGS

In FIGS. 1 through 9, similar features are denoted by similar reference characters.

DESCRIPTION OF THE INVENTION

The present invention addresses and provides a solution to the problem of forming micro-miniaturized semiconductor devices having scaled down MOSFETs with significantly reduced short channel effects and reduced silicide contact resistance. This objective is achieved, in part, by forming accurately defined, uniformly high concentrated source/drain regions and extensions employing plural pre-amorphizing and laser thermal annealing steps with intervening sidewall spacer removal. By advantageously employing laser thermal annealing, very locally and sharply defined source/drain regions and extensions are formed in an extremely short period of time without dopant diffusion as would occur in conventional practices The combination of preamorphizing and laser thermal annealing also enables the formation of highly concentrated dopant regions as supersaturated dopants are frozen in accurately defined pre-amorphized regions.

An embodiment of the present invention is schematically illustrated in FIGS. 1 through 9. Adverting to FIG. 1, a gate electrode 11 is formed over a substrate 10, e.g., doped monocrystalline silicon, with a gate insulating layer 12 therebetween, e.g., silicon oxide. The gate electrode 11 typically has a width of about 100 Å to 1,000 Å, and the gate oxide layer 12 typically has a thickness of 30 Å to 200 Å. Dielectric sidewall spacers are then formed on the side surfaces of the gate electrode, such as silicon nitride sidewall spacers. In the depicted embodiment, an oxide liner 13, such as silicon oxide, is initially formed on side surfaces of gate electrode 11 and extends on a portion of the upper surface of substrate 10 on each side of gate electrode 11. Silicon oxide liner 13 typically has a thickness of 200 Å to 600 Å.

Figure 1:
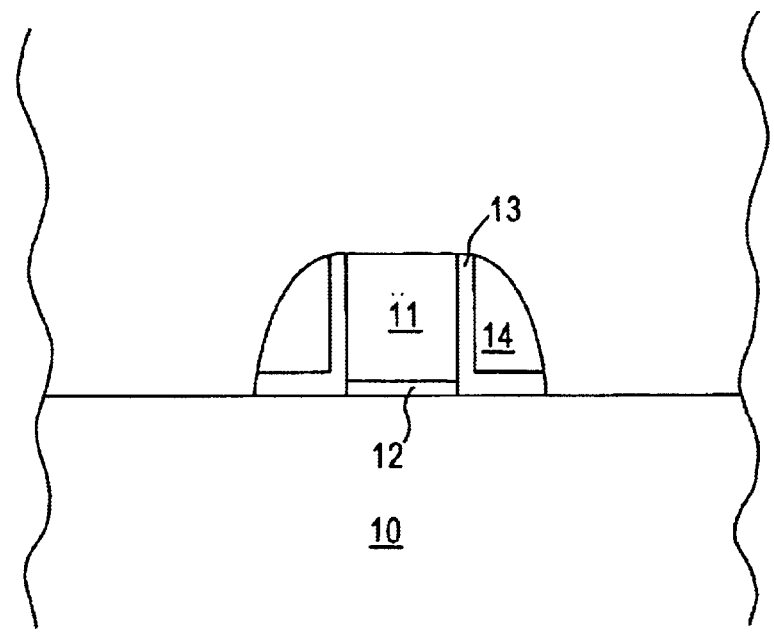
FIGS. 1 through 9 schematically illustrate sequential phases of a method in accordance with an embodiment of the present invention.
Figure 2:
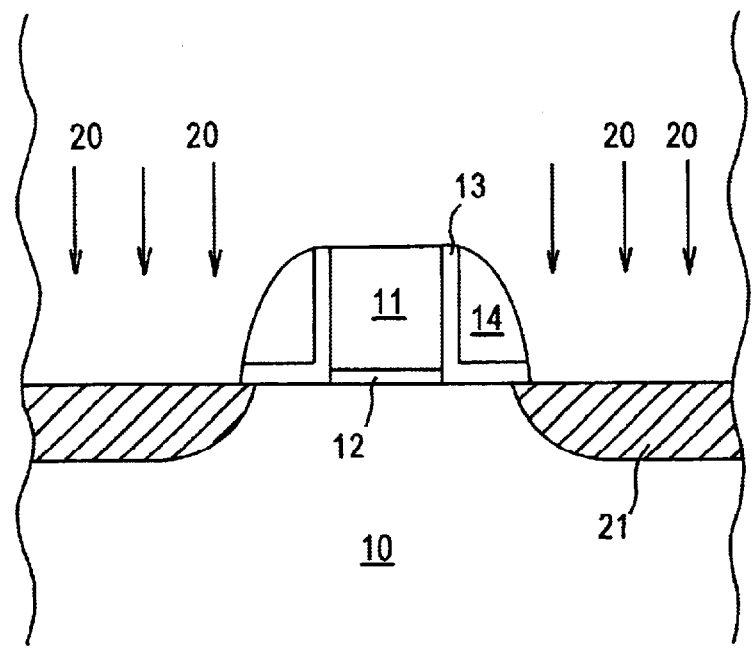
Figure 3:
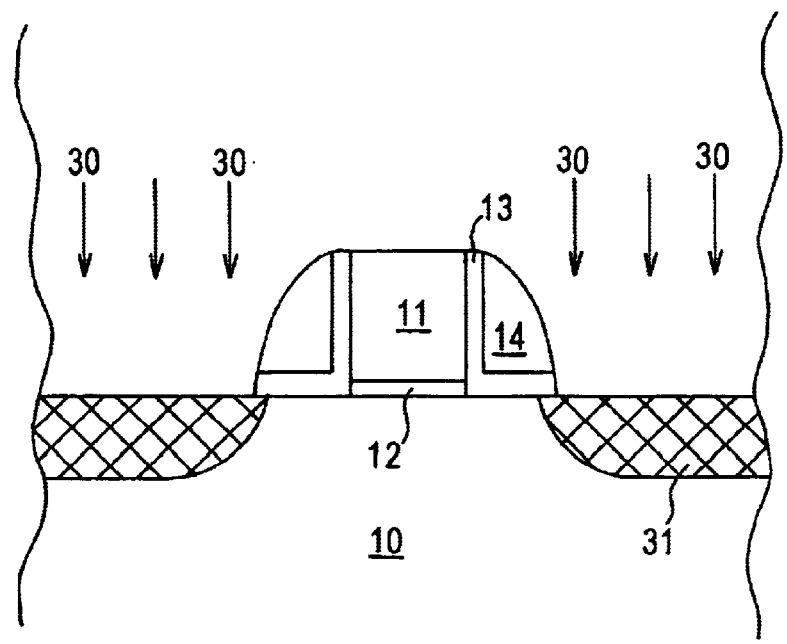

Adverting to FIG. 2, ion implantation is then conducted, as indicated by arrows 20, to form deep pre-amorphized regions, which ultimately define the deep source/drain regions, as at a depth of 500 Å to 2000 Å. Such pre-amorphizing may be implemented by ion implanting an element such as silicon (Si), germanium (Ge) or Xenon (Xe). For example, Xe may be implanted at an implantation dosage of $1\times10^{14}$ to $5\times10^{14}$ ions/cm$^2$ at an implantation energy of 20 to 80 KeV to form deep pre-amorphized regions at 21. Subsequently, ion implantation is conducted, as illustrated by arrows 30 in FIG. 3, to implant impurities into pre-amorphized regions 21 forming deep source/drain implants 31. Ion implantation 30 to form deep source/drain implants may be implanted by implanting P (for an n-channel MOSFET) at a dosage of $1\times10^{15}$ to $1\times10^{16}$ ions/cm$^2$ at a an implantation energy of 10 to 30 KeV.

Figure 4:
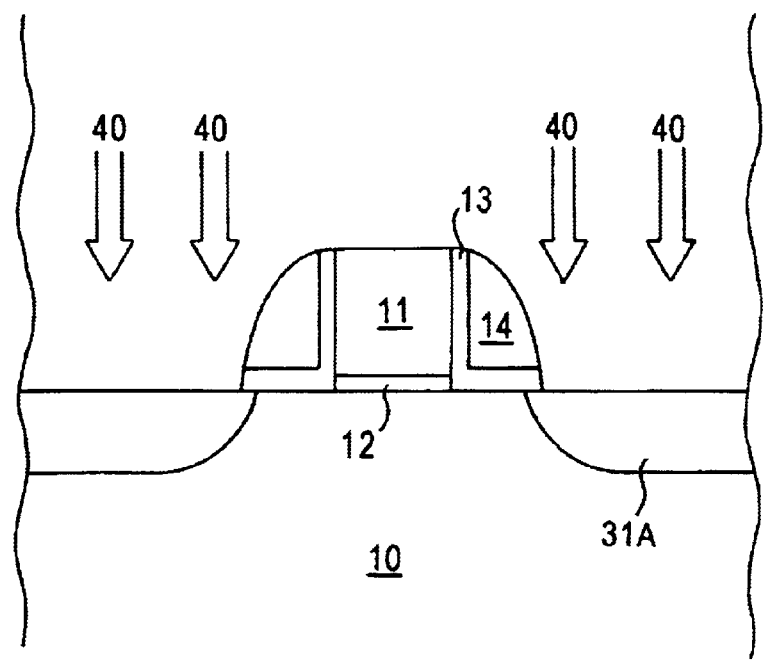

Laser thermal annealing is then conducted, as by impinging a pulsed laser light beam 40, illustrated in FIG. 4, at the deep pre-amorphized ion implanted regions 31 to effect recrystallization of the deep pre-amorphized regions and activation of deep source/drain regions 31A. During laser thermal annealing, the substrate is rapidly heated to 1,200° C. to 1,300° C. and rapidly coded such that the supersaturated dopant concentration of the pre-amorphized regions is forzen resulting in a high dopant concentration at the upper surface of the substrate. In this way, silicide contact resistance is reduced.

Figure 5:
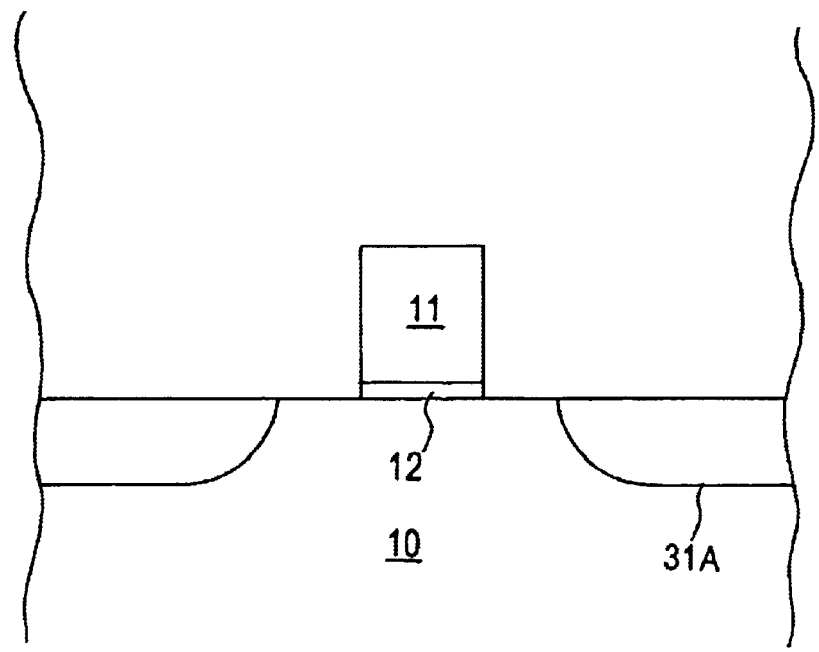

Subsequently, silicon nitride sidewall spacers 14 and silicon oxide liner 13 are then removed. Silicon nitride sidewall spacers can be removed employing a conventional etching technique, as with a boiling phosphoric acid solution. Silicon oxide liners 13 can be removed employing a conventional etching technique, as with a buffered hydrofluoric acid solution. The resulting intermediate structure is shown in FIG. 5.

Figure 6:
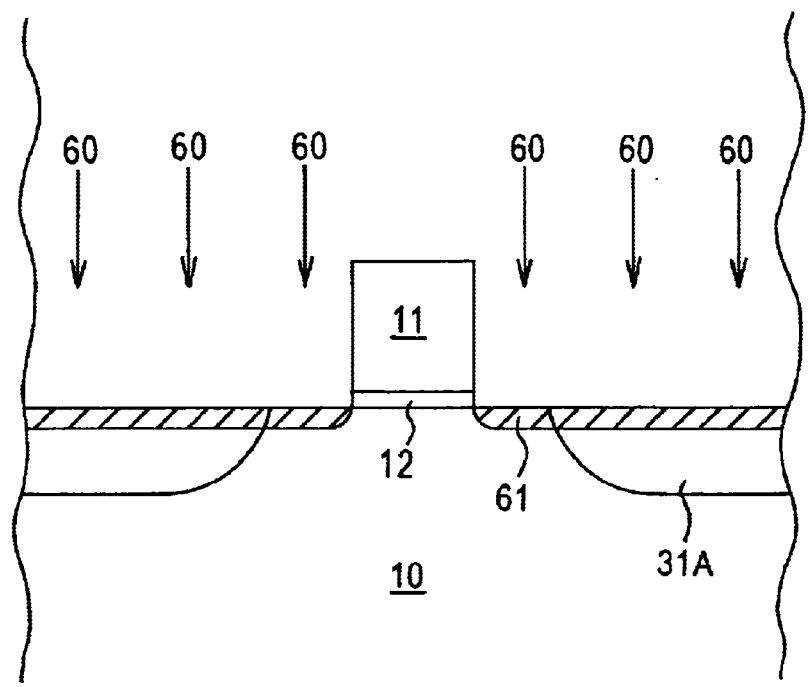

Ion implantation is then conducted, as illustrated by arrows 60 in FIG. 6, to form shallow pre-amorphized regions 61 extending from side surfaces of the gate electrode 11. Such shallow pre-amorphized regions 61 define the future source/drain extensions. The shallow pre-amorphized regions 61 typically extend into the semiconductor substrate to a depth of 50 Å to 200 Å and may be formed by implanting Xe at a dosage of $1\times10^{14}$ to $5\times10^{14}$ ions/cm$^2$ at an implantation energy of 40 to 80 KeV.

Figure 7:
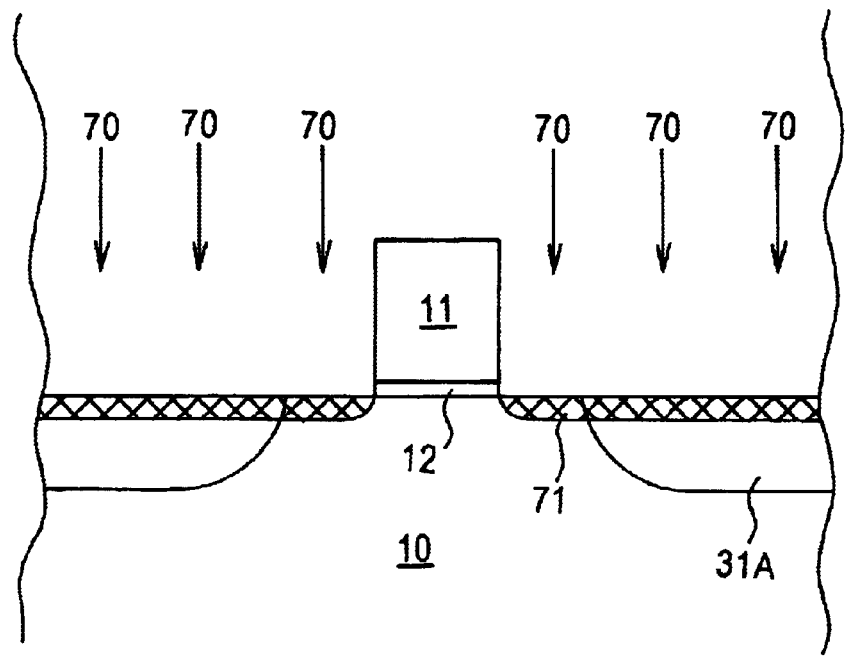

Ion implantation is then conducted, as illustrated arrows 70 in FIG. 7, to ion implant a high dose of impurities into the shallow pre-amorphized regions 61 forming shallow source/drain implants 71A therein. Ion implantation 70 can be implemented by implanting As (for an n-channel MOSFET) at a dosage of $1\times10^{14}$ to $1\times10^{15}$ ions/cm$^2$ at an implantation energy of 1 to 5 KeV to form shallow source/drain implants 71.

Figure 8:
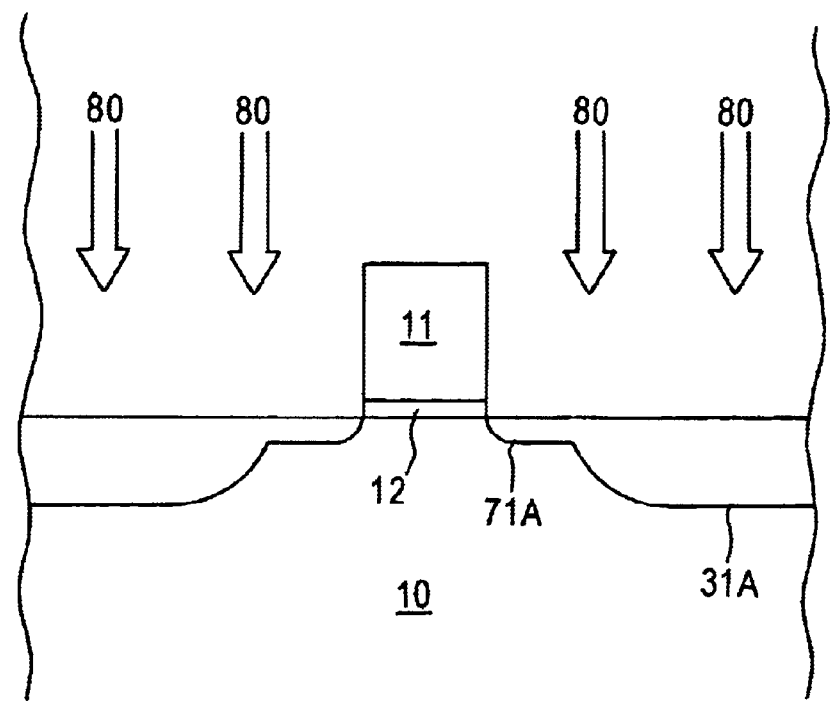

Laser thermal annealing is then conducted, as illustrated by arrows 80 in FIG. 8, to recrystallize the shallow pre-amorphized regions 61 and activate the shallow source/drain extensions 71A. Such laser thermal annealing may be implemented by impinging a pulsed laser light beam at a radiant fluence of 0.2 to 0.8 joules/cm$^2$ for 1 to 10 nanoseconds, thereby rapidly elevating the substrate temperature to 1200° C. to 1300° C. followed by rapid quenching.

Figure 9:
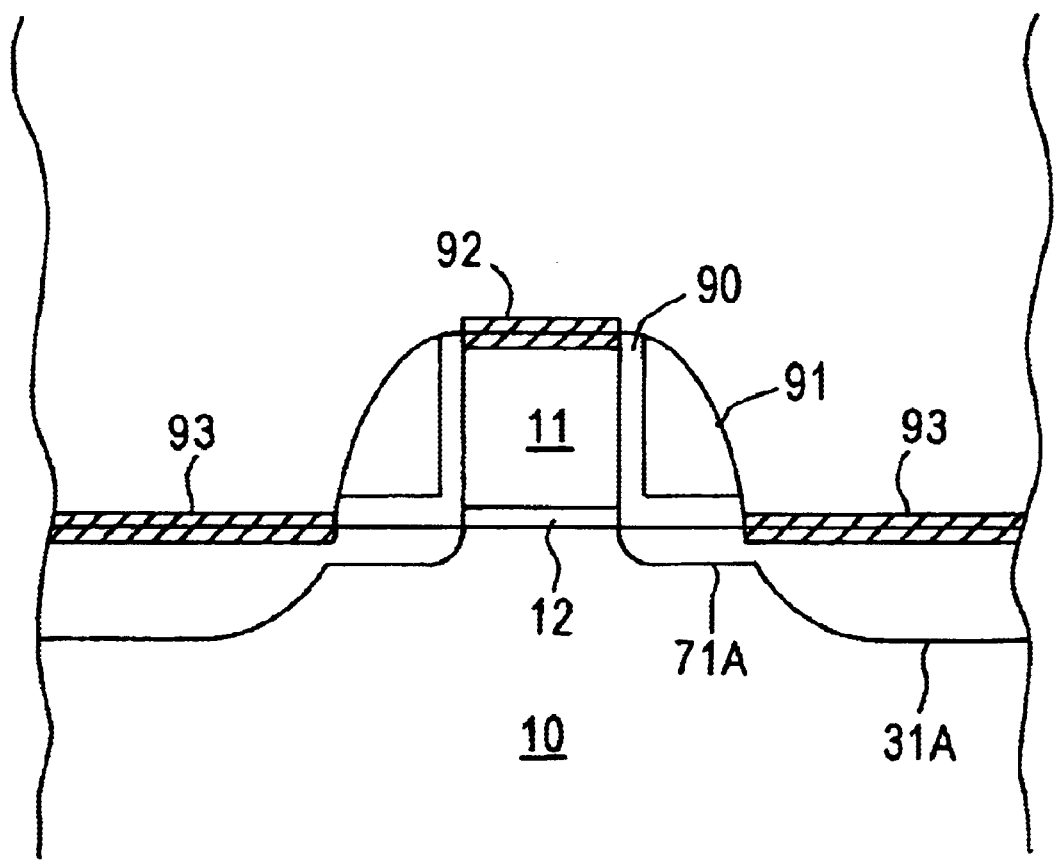

Subsequently, as illustrated in FIG. 9, an oxide liner 90 is formed on the side surfaces of gate electrode 11, such as a silicon oxide liner, typically at a thickness 30 Å to 200 Å. Silicon nitride sidewall spacers 91 are then formed on the silicon oxide liner. Metal silicidation is then conducted, as by forming nickel, cobalt or tungsten silicide layers 92 on the upper surface of gate electrode 11 and 93 over the deep source/drain regions 31A. The uniformly high dopant concentration at the upper surface of source/drain region 31A advantageously enables a reduction in silicide contact resistance. The dopant concentration at the upper surface of source/drain regions 31A is typically $1\times10^{19}$ to $1\times10^{20}$ atoms cm$^3$.

The strategic combined use of pre-amorphizing and laser thermal annealing, with intermediate spacer removal, enables the formation of precisely defined source/drain extensions and regions without inter-diffusion, and the formation of deep source/drain regions having a uniformly high impurity concentration at the upper surface for reduced silicide contact resistance. The use of a laser light beam enables an extremely rapid heating and cooling cycle, thereby controlling the thermal budget and enabling the formation of abrupt, locally contained impurity regions without diffusion therebetween, and with high reproducibility. Further, the use of a laser light beam enables pin-point accuracy in targeting a specific area of the substrate, thereby avoiding unnecessarily elevating the temperature of other portions of the wafer causing various problems, such as defects and diffusion issues.

In implementing embodiments of the present invention, any of various commercially available laser tools may be employed, such as those utilizing a laser source capable of operating at energies of about 10 to about 2,0000 m/cm$^2$/pulse, e.g., about 100 to 400 m/cm$^2$/pulse. Commercially available tools exist which can perform such laser annealing, either with or without mask. The Verdant Technologies laser anneal tool is but an example and operates at an exposure wavelength of 308 nm.

The present invention enables the manufacture of micro-miniaturized semiconductor devices with scaled down MOSFETs having sharply defined source/drain extensions, thereby significantly reducing short channel effects. The present invention also enables fabrication of micro-miniaturized semiconductor devices with significantly reduced silicide contact resistance by forming deep source/drain regions with a uniformly high dopant concentration at the upper surface of the substrate.

The present invention enjoys industrial applicability in fabricating various types of highly miniaturized semiconductor devices with improved reliability, high performance speed and increased reproducibility. The present invention has particular applicability in fabricating semiconductor devices with design features in the deep sub-micron regime, as with a design rule less than about 0.12 micron, with significantly improved reliability and high performance speed.

In the preceding detailed description, the present invention is described with reference to specific exemplary embodiments thereof. It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a gate electrode, having an upper surface and side surfaces, over an upper surface of a substrate with a gate insulating layer therebetween;

forming first sidewall spacers on the side surfaces of the gate electrode;

ion implanting to form deep pre-amorphized regions extending into the substrate defining future source/drain regions;

ion implanting an impurity into the deep pre-amorphized regions forming deep source/drain implants;

laser thermal annealing to recrystallize the deep pre-amorphized regions and activate the deep source/drain regions;

removing the first sidewall spacers;

ion implanting to form shallow pre-amorphized regions on each side of the gate electrode extending into the substrate defining future shallow source/drain extensions;

ion implanting an impurity into the shallow pre-amorphized regions; and laser thermal annealing to recrystallize the shallow pre-amorphized regions and activate the shallow source/drain extensions.

2. The method according to claim 1, comprising forming silicon nitride sidewall spacers as the first sidewall spacers.

3. The method according to claim 1, comprising:

forming an oxide liner on the side surfaces of the gate electrode and on a portion of the upper surface of the substrate adjacent the side surfaces of the gate electrode;

forming silicon nitride sidewall spacers, as the first sidewall spacers, on the outside liner; and removing the first silicon nitride sidewall spacers and oxide liner after laser thermal annealing to recrystallize the deep pre-amorphized regions and activate the deep source/drain regions.

4. The method according to claim 1, further comprising:

forming second sidewall spacers on the side surfaces of the gate electrode after laser thermal annealing to recrystallize the shallow pre-amorphized regions and activate the shallow source/drain extensions; and forming metal silicide layers on the upper surface of the gate electrode and on the upper surface of the substrate over the deep source/drain regions.

5. The method according to claim 4, comprising forming silicon nitride sidewall spacers as the second sidewall spacers.

6. The method according to claim 4, comprising:

forming an oxide liner on the side surfaces of the gate electrode and on a portion of the upper surface of the substrate adjacent the side surfaces of the gate electrode; and forming silicon nitride sidewall spacers, as the second sidewall spacers, on the outside liner.

7. The method according to claim 1, comprising laser thermal annealing by impinging a laser light beam at a radiant fluence of 0.2 to 0.8 joules/cm$^2$ for 1 to 10 nanoseconds to recrystallize the deep pre-amorphized regions and activate the deep source/drain regions.

8. The method according to claim 7, comprising laser thermal annealing by impinging a laser light beam at a radiant fluence of 0.2 to 0.8 joules/cm$^2$ for 1 to 10 nanoseconds to recrystallize the shallow pre-amorphized regions and activate the shallow source/drain extensions.

9. The method according to claim 1, comprising ion implanting an impurity into the deep pre-amorphized regions at a first implantation dosage and ion implanting an impurity into the shallow pre-amorphized region at a second implantation dosage greater than the first implantation dosage.

10. The method according to claim 1, wherein the activated deep source/drain regions have an upper surface at the main surface of the substrate comprising a relatively high concentration of impurities, while the remainder of the deep source/drain regions has a concentration of impurities less than that at the surface.

11. The method according to claim 10, wherein the source/drain regions have an impurity concentration of $1 \times 10^{19}$ to $1 \times 10^{20}$ atoms/cm$^3$ at the upper surface of the substrate.

* * * * *